(12) United States Patent
Choi et al.

(10) Patent No.: US 9,679,750 B2
(45) Date of Patent: Jun. 13, 2017

(54) DEPOSITION APPARATUS

(71) Applicant: ASM IP Holding B.V., Almere (NL)

(72) Inventors: Young Seok Choi, Daejeon (KR); Dae Youn Kim, Daejeon (KR)

(73) Assignee: ASM IP HOLDING B.V., Almere (NL)

(*) Notice: Subject to any disclaimer, the term of this patent is extended or adjusted under 35 U.S.C. 154(b) by 310 days.

(21) Appl. No.: 14/275,912

(22) Filed: May 13, 2014

(65) Prior Publication Data
US 2014/0338601 A1  Nov. 20, 2014

(30) Foreign Application Priority Data

May 15, 2013 (KR) .................. 10-2013-0054984

(51) Int. Cl.
*H01J 37/32* (2006.01)

(52) U.S. Cl.
CPC .... *H01J 37/32449* (2013.01); *H01J 37/3244* (2013.01); *H01J 37/32357* (2013.01); *H01J 37/32541* (2013.01); *H01J 37/32568* (2013.01)

(58) Field of Classification Search
CPC ........... H01J 37/32449; H01J 37/32568; H01J 37/32357; H01J 37/32541; H01J 37/3244
USPC ........ 118/723 E; 156/345.33, 345.34, 345.43
See application file for complete search history.

(56) References Cited

U.S. PATENT DOCUMENTS

| | | | | |
|---|---|---|---|---|
| 4,976,217 A | * | 12/1990 | Frijlink | C30B 25/14 118/715 |
| 5,198,724 A | * | 3/1993 | Koinuma | B29C 47/12 156/345.43 |
| 5,221,427 A | * | 6/1993 | Koinuma | B29C 59/14 156/345.46 |
| 5,314,540 A | * | 5/1994 | Nakamura | C23C 16/276 118/723 DC |
| 5,369,336 A | * | 11/1994 | Koinuma | B29C 59/14 257/E21.218 |
| 5,549,780 A | * | 8/1996 | Koinuma | B29C 59/14 118/723 E |
| 5,733,610 A | * | 3/1998 | Okazaki | C23C 16/30 427/255.6 |
| 5,792,272 A | * | 8/1998 | van Os | C23C 16/4405 118/723 I |
| 5,846,330 A | * | 12/1998 | Quirk | C23C 16/513 118/715 |
| 5,851,294 A | * | 12/1998 | Young | C23C 16/45508 118/715 |
| 5,902,404 A | * | 5/1999 | Fong | H01J 37/32247 118/723 ME |
| 5,951,771 A | * | 9/1999 | Raney | C23C 16/4551 118/723 ER |
| 6,013,153 A | * | 1/2000 | Koinuma | B29C 59/106 156/272.6 |

(Continued)

*Primary Examiner* — Rudy Zervigon
(74) *Attorney, Agent, or Firm* — Lex IP Meister, PLLC (57) ABSTRACT

A deposition apparatus according to an exemplary embodiment of the present invention includes: a reactor; a plasma chamber connected to the reactor; a plasma electrode mounted inside of the plasma chamber; and a gas supply plate coupled with the plasma chamber to supply gas into the plasma chamber, wherein a plurality of gas holes is formed at an inner wall of the gas supply plate, and the plurality of gas supply holes is spaced apart from each other by a predetermined interval.

11 Claims, 6 Drawing Sheets

(56) References Cited

U.S. PATENT DOCUMENTS

| | | | | |
|---|---|---|---|---|
| 6,020,570 A * | 2/2000 | Taki | H01J 37/321 | 118/723 MP |
| 6,123,775 A * | 9/2000 | Hao | C23C 16/45572 | 118/715 |
| 6,245,192 B1 * | 6/2001 | Dhindsa | C23C 16/455 | 156/345.34 |
| 6,245,396 B1 * | 6/2001 | Nogami | C23C 16/4405 | 118/723 ER |
| 6,284,673 B2 * | 9/2001 | Dunham | C23C 16/45565 | 427/255.28 |
| 6,402,849 B2 * | 6/2002 | Kwag | C23C 16/4412 | 118/715 |
| 6,432,831 B2 * | 8/2002 | Dhindsa | C23C 16/455 | 438/710 |
| 6,666,920 B1 * | 12/2003 | Sillmon | C30B 25/14 | 118/715 |
| 6,716,289 B1 * | 4/2004 | Sillmon | C23C 16/4412 | 118/715 |
| 6,764,658 B2 * | 7/2004 | Denes | B29C 59/14 | 118/723 E |
| 6,872,258 B2 * | 3/2005 | Park | C23C 16/45565 | 118/715 |
| 7,017,514 B1 * | 3/2006 | Shepherd, Jr. | C23C 16/452 | 118/723 ME |
| 7,204,886 B2 * | 4/2007 | Chen | C23C 16/45502 | 118/715 |
| 7,252,716 B2 * | 8/2007 | Kim | C23C 16/4558 | 118/715 |
| 7,572,337 B2 * | 8/2009 | Rocha-Alvarez | C23C 16/4405 | 118/715 |
| 7,699,023 B2 * | 4/2010 | Chen | C23C 16/34 | 118/715 |
| 7,780,789 B2 * | 8/2010 | Wu | C23C 16/34 | 118/715 |
| 7,806,078 B2 * | 10/2010 | Yoshida | C23C 16/455 | 118/723 I |
| 8,236,106 B2 * | 8/2012 | Iizuka | C23C 16/4412 | 118/50 |
| 8,277,561 B2 * | 10/2012 | Kim | C23C 16/45508 | 118/715 |
| 8,291,857 B2 * | 10/2012 | Lam | C23C 16/4412 | 118/715 |
| 8,298,338 B2 * | 10/2012 | Kim | C23C 16/4412 | 118/715 |
| 8,382,939 B2 * | 2/2013 | Kutney | H01J 37/3244 | 118/50 |
| 8,668,775 B2 * | 3/2014 | Moshtagh | C23C 16/45504 | 118/715 |
| 8,846,539 B2 * | 9/2014 | Dhindsa | H01J 37/32009 | 118/723 E |
| 9,096,933 B2 * | 8/2015 | Savas | C23C 16/24 | |
| 9,318,535 B2 * | 4/2016 | Jung | H01L 27/32 | |
| 2001/0003271 A1 * | 6/2001 | Otsuki | C23C 16/4404 | 118/723 I |
| 2001/0050054 A1 * | 12/2001 | Kwag | C23C 16/4412 | 118/715 |
| 2002/0017244 A1 * | 2/2002 | Sillmon | C23C 16/4412 | 118/715 |
| 2002/0078893 A1 * | 6/2002 | Os | C23C 16/4558 | 118/723 I |
| 2002/0153103 A1 * | 10/2002 | Madocks | C23C 14/352 | 156/345.46 |
| 2003/0047282 A1 * | 3/2003 | Sago | C23C 16/45565 | 156/345.34 |
| 2003/0121608 A1 * | 7/2003 | Chen | C23C 16/34 | 156/345.33 |
| 2004/0001787 A1 * | 1/2004 | Porshnev | B01D 53/68 | 423/210 |
| 2004/0099378 A1 * | 5/2004 | Kim | C23C 16/4558 | 156/345.33 |
| 2004/0144311 A1 * | 7/2004 | Chen | C23C 16/45502 | 118/715 |
| 2005/0000441 A1 * | 1/2005 | Kaeppeler | C23C 16/45568 | 118/723 E |
| 2005/0003600 A1 * | 1/2005 | Kasai | C23C 16/14 | 438/200 |
| 2006/0021574 A1 * | 2/2006 | Armour | C23C 16/45565 | 118/715 |
| 2006/0112876 A1 * | 6/2006 | Choi | C23C 16/45563 | 118/715 |
| 2007/0119371 A1 * | 5/2007 | Ma | C23C 16/18 | 118/723 E |
| 2008/0063798 A1 * | 3/2008 | Kher | C23C 16/34 | 427/255.394 |
| 2008/0102203 A1 * | 5/2008 | Wu | C23C 16/34 | 427/248.1 |
| 2008/0236495 A1 * | 10/2008 | Tompa | C23C 16/45565 | 118/724 |
| 2009/0065485 A1 * | 3/2009 | O'Neill | H05H 1/46 | 219/121.52 |
| 2009/0162261 A1 * | 6/2009 | Baera | H01J 37/32449 | 422/186.04 |
| 2009/0165713 A1 * | 7/2009 | Kim | C23C 16/4412 | 118/719 |
| 2009/0241833 A1 * | 10/2009 | Moshtagh | C23C 16/45504 | 118/715 |
| 2009/0260569 A1 * | 10/2009 | Kim | C23C 16/45508 | 118/715 |
| 2009/0260572 A1 * | 10/2009 | Kim | C23C 16/45574 | 118/730 |
| 2009/0288604 A1 * | 11/2009 | Kim | C23C 16/45508 | 118/726 |
| 2010/0003406 A1 * | 1/2010 | Lam | C23C 16/4412 | 427/255.391 |
| 2010/0300359 A1 * | 12/2010 | Armour | C23C 16/45565 | 118/724 |
| 2011/0006038 A1 * | 1/2011 | Kutney | H01J 37/3244 | 216/58 |
| 2011/0223334 A1 * | 9/2011 | Yudovsky | C23C 16/45504 | 427/255.23 |
| 2012/0000422 A1 * | 1/2012 | Lam | C23C 16/4412 | 118/715 |
| 2014/0138030 A1 * | 5/2014 | Sawada | C23C 16/45565 | 156/345.29 |
| 2014/0261177 A1 * | 9/2014 | Rasheed | C23C 14/0063 | 118/720 |
| 2015/0040829 A1 * | 2/2015 | Ramaswamy | H01J 37/32596 | 118/723 E |
| 2015/0371828 A1 * | 12/2015 | Stowell | H01J 37/32192 | 216/69 |

* cited by examiner

DEPOSITION APPARATUS

CROSS-REFERENCE TO RELATED APPLICATION

This application claims priority to and the benefit of Korean Patent Application No. 10-2013-0054984 filed in the Korean Intellectual Property Office on May 15 2013, the entire contents of which are incorporated herein by reference.

BACKGROUND OF THE INVENTION (a) Field of the Invention

The present invention relates to a deposition apparatus.

(b) Description of the Related Art

A physical vapor deposition (PVD) process, a chemical vapor deposition (CVD) process, and the like have been used as a method of depositing a thin film on a silicon substrate.

However, the existing deposition process has a limitation due to a reduction in the size of a semiconductor device. An atomic layer deposition (ALD) technique has been introduced as a next generation deposition process and the ALD technique has been extensively applicable.

In the ALD technique, a thin film is deposited on a substrate by a self-limiting process, and a process is performed at a temperature range in which a chemical reaction between reaction gases is achieved without being thermally decomposed. Accordingly, the ALD technique is advantageous in that a thin film may be deposited at a lower temperature compared to a temperature required for the existing CVD process.

The ALD technique includes a thermal ALD technique to activate reaction between reaction gases on a substrate by supplying heat energy from a heater supporting the substrate, and a plasma enhanced ALD technique to induce reaction between reaction gases by supplying plasma into a reaction space in addition to a heat source of a heater. Since reaction may be induced if plasma is supplied to reaction gas which may not be reacted in the existing thermal ALD technique, a process that should not be implemented in the thermal ALD technique may deposit a thin film having various thin quality through a plasma ALD technique. In recent years, research and studies with respect to this have been actively performed.

Deposition devices used with plasma use a method of remotely supplying plasma. Since the plasma is remotely supplied, uniform plasma is not supplied on a substrate on which a thin film is deposited and plasma generation efficiency is degraded.

Accordingly, compared with the method of remotely supplying the plasma, as a method capable of increasing efficiency of the plasma, an in-situ plasma deposition apparatus in which plasma is directly generated in a reaction space has been developed since a plasma electrode transferring the plasma defines a reaction space in a reactor.

However, in a case of the in-situ plasma deposition apparatus, with accelerated electrons or ions generated by the plasma, a surface of a thin film formed on the substrate is damaged so that a characteristic of the device is deteriorated.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a deposition apparatus having advantages of preventing a surface of a thin film formed on a substrate from being damaged by accelerated electrons or accelerated ions generated by plasma while increasing plasma generation efficiency by uniformly supplying the plasma on the substrate on which the thin film is deposited.

An exemplary embodiment of the present invention provides a deposition apparatus including: a reactor; a plasma chamber connected to the reactor; a plasma electrode mounted inside of the plasma chamber; and a gas supply plate coupled with the plasma chamber to supply gas into the plasma chamber, wherein a plurality of gas holes are formed at an inner wall of the gas supply plate, and the plurality of gas supply holes are spaced apart from each other by a predetermined interval.

The plasma electrode may have a cylindrical shape, and a plasma generation part may be generated in a space between an inner wall of the plasma chamber and the plasma electrode.

The space between an inner wall of the plasma chamber and the plasma electrode may have a predetermined width.

The gas supply plate may have a ring structure, and the plurality of gas supply holes may surround a periphery of the plasma electrode.

The gas supply plate may include a plurality of partitions which are formed inside of the gas supply plate, and the plurality of partitions may include a plurality of gas paths.

The plurality of partitions of the gas supply plate may have a ring structure, and may be spaced apart from each other by a predetermined interval.

The deposition apparatus according to an exemplary embodiment of the present invention can prevent a surface of a thin film formed on a substrate from being damaged by accelerated electrons or accelerated ions generated by plasma while increasing the plasma generation efficiency by uniformly supplying the plasma on the substrate on which the thin film is deposited.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1A:
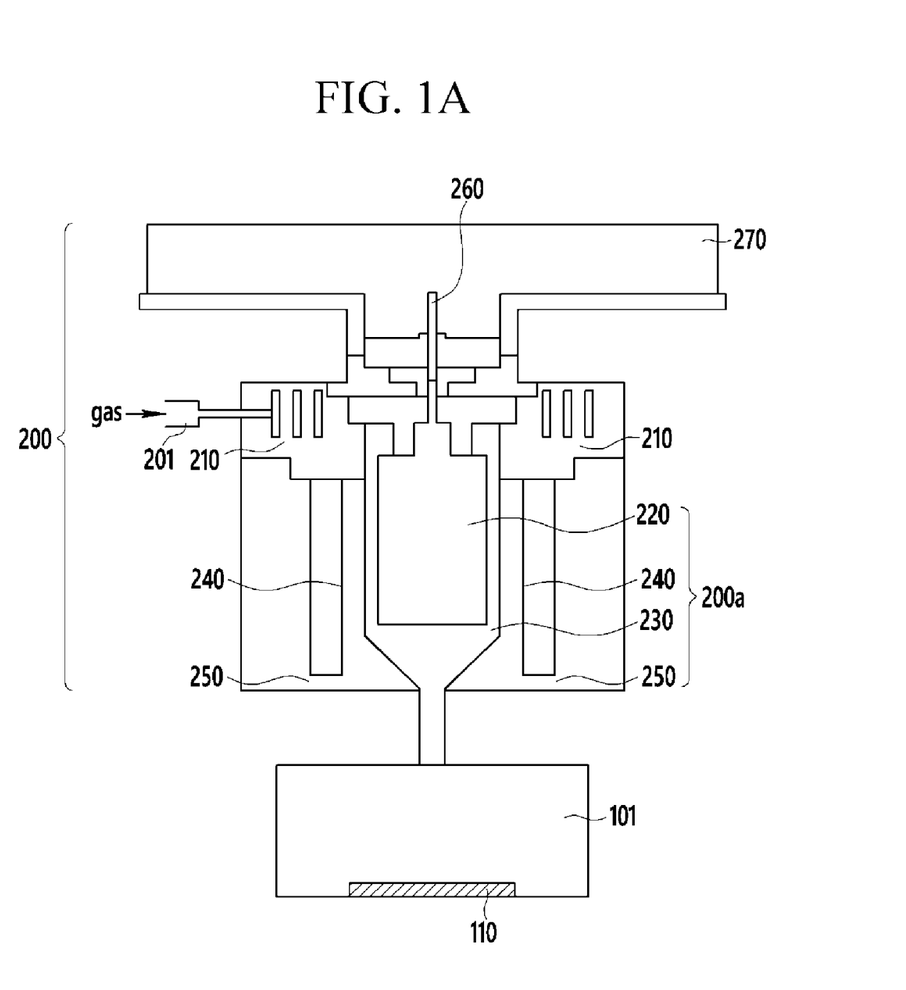
FIG. 1A is a sectional view illustrating a deposition apparatus according to an exemplary embodiment of the present invention.

First, a deposition apparatus according to an exemplary embodiment of the present invention will be described with reference to FIGS. 1A, 1B and 2. FIG. 1A is a sectional view illustrating a deposition apparatus according to an exemplary embodiment of the present invention, FIG. 1B is a perspective view illustrating a plasma electrode and a high frequency connection terminal, and FIG. 2 is a sectional view illustrating a part of the deposition apparatus according to an exemplary embodiment of the present invention.

Figure 1B:
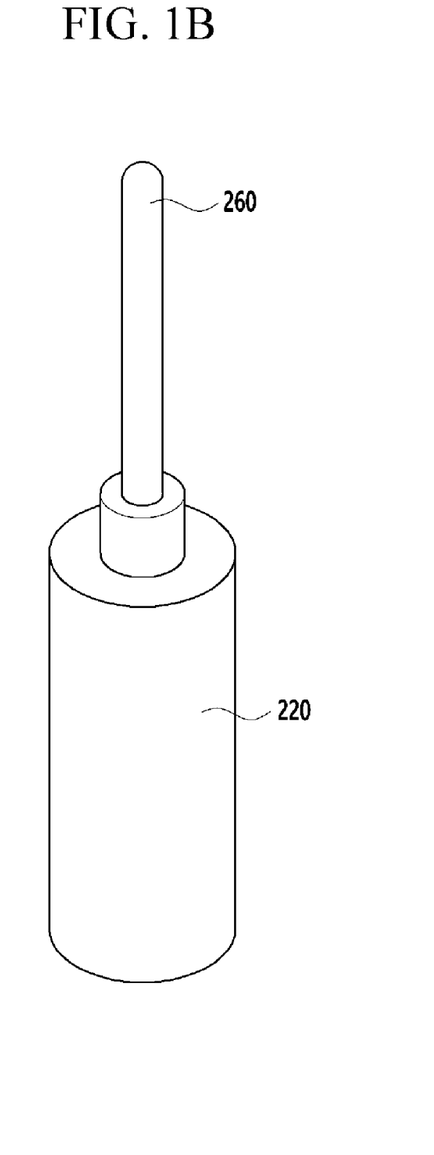
FIG. 1B is a perspective view illustrating a plasma electrode and a high frequency connection terminal.
Figure 2:
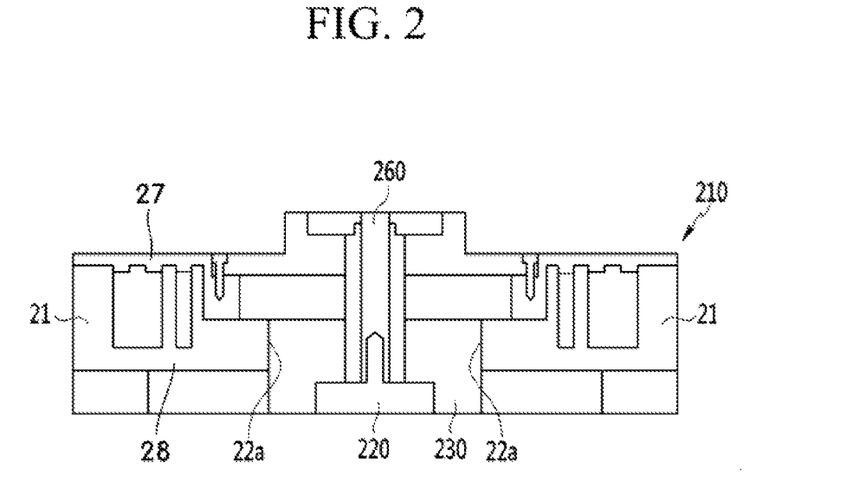
FIG. 2 is a sectional view illustrating a part of the deposition apparatus according to an exemplary embodiment of the present invention.

Referring to FIGS. 1A and 1B, the deposition apparatus according to the exemplary embodiment of the present invention includes a reactor 101 and a plasma processor 200. A substrate 110 is placed in the reactor 101, a thin film is deposited on the substrate 110, and the plasma processor 200 supplies gas processed by the plasma into the reactor 101.

The plasma processor 200 includes a gas supply plate 210 and a plasma chamber 200a. A lower portion of the plasma chamber 200a is connected to the reactor 101.

The plasma chamber 200a includes a cylindrical plasma electrode 220, a plasma generation part 230, an insulator 240 to surround the outside of the plasma generation part 230, and an outer wall 250 disposed outside of the insulator 240.

The deposition apparatus according to an exemplary embodiment of the present invention includes a high frequency connection terminal 260 connected to the plasma electrode 220 and a remote high frequency power generator 270.

Respective constituent elements will now be described in detail.

The gas supply plate 210 serves to receive gas from a gas supply hole 201, and to uniformly supply the received gas to the plasma generation part 230. The gas supply plate 210 has a ring structure with a plurality of gas movement routes and gas paths, and gas inlet holes.

The gas supply plate 210 is coupled with the plasma chamber 200a to define the plasma generation part 230 for generating plasma.

The plasma generation part 230 is defined by a space between the plasma electrode 220 and an inner wall of the plasma chamber 200a as a space to surround the cylindrical plasma electrode 220.

The space between the cylindrical plasma electrode 220 and the inner wall of the plasma chamber 200a has a predetermined interval. It is preferable that the predetermined interval is not changed according to a location.

The plasma electrode 220 disposed outside of the reactor 101 receives high frequency power from the high frequency power generator 270 through the high frequency connection terminal 260.

The plasma electrode 220 may be cylindrical, and may include aluminum.

The plasma electrode 220 receives high frequency power from the high frequency power generator 270, and generates capacitance coupled plasma (CCP) in the plasma generation part 230 of the plasma chamber 220a.

The gas provided from the gas inlet portion 201 is introduced into the plasma generation part 230 through the gas supply plate 210 having a ring structure, and the gas introduced into the plasma generation part 230 is plasma-processed through high frequency power transferred to the plasma electrode 220 and the plasma-processed gas is supplied to the reactor 101.

Referring to FIG. 2 together with FIGS. 1A and 1B, the deposition apparatus according to an exemplary embodiment of the present invention includes the plasma chamber 200a disposed outside of the reactor 101, and uniformly supplies gas to the plasma generation part 230 around the plasma electrode 220 through the gas supply plate 210 which is coupled with the plasma chamber 200a to define the plasma generation part 230.

The gas supply plate 210 has a ring structure, and a plurality of gas inlet holes 23a are formed in an inner sidewall 22a of the gas supply plate 210. The plasma electrode 220 and the high frequency connection terminal 260 are spaced apart from an inner sidewall 22a of the gas supply plate 210 at predetermined interval, and the plurality of gas inlet holes 23a are spaced apart from each other by a predetermined interval so that the gas is simultaneously introduced from the plurality of gas inlet holes 23a, gas having uniform concentration may be uniformly supplied to any position of the plasma generation part 230 surrounding the plasma electrode 220.

In this manner, plasma having uniform concentration may be generated in the plasma generation part 230 by uniformly supplying gas to the plasma generation part 230. Accordingly, the plasma-processed reaction gas having uniform concentration may be supplied to the reactor 101.

Figure 3:
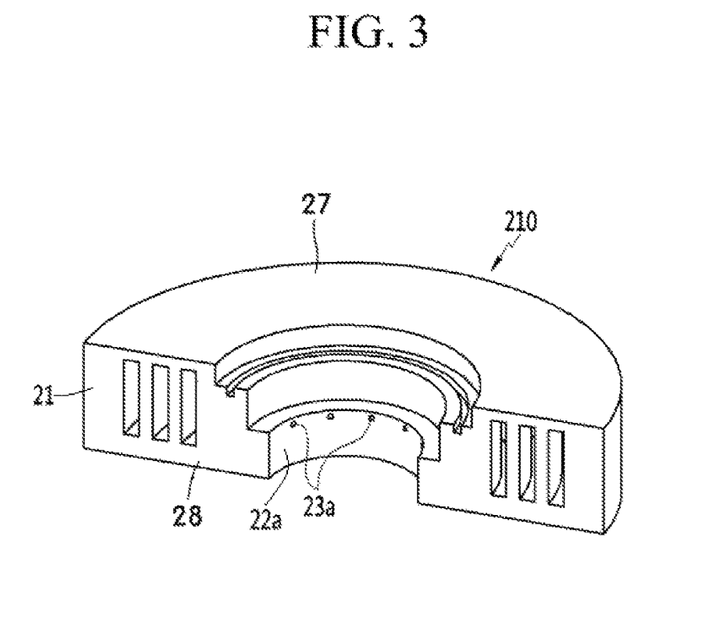
FIG. 3 is a view illustrating a section of a gas supply plate of the deposition apparatus according to an exemplary embodiment of the present invention.
Figure 4:
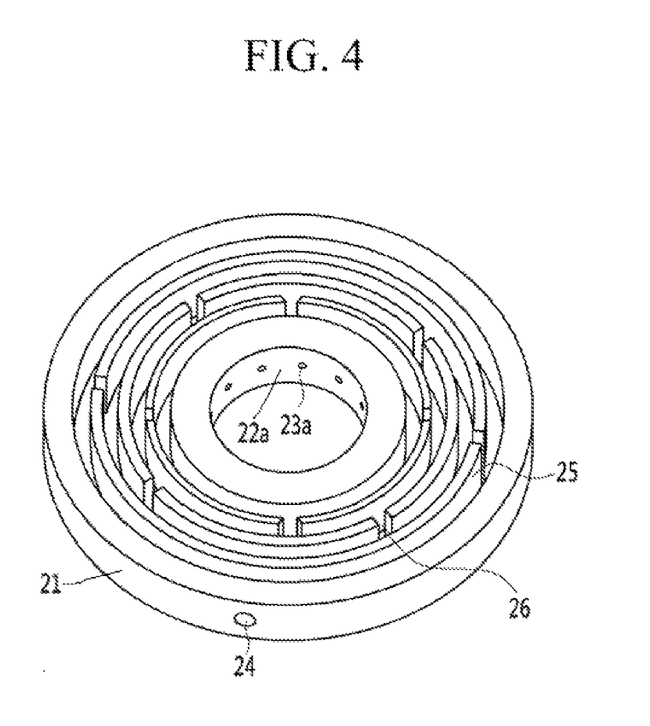
FIG. 4 is a perspective view illustrating the gas supply plate according to an exemplary embodiment of the present invention.
Figure 5:
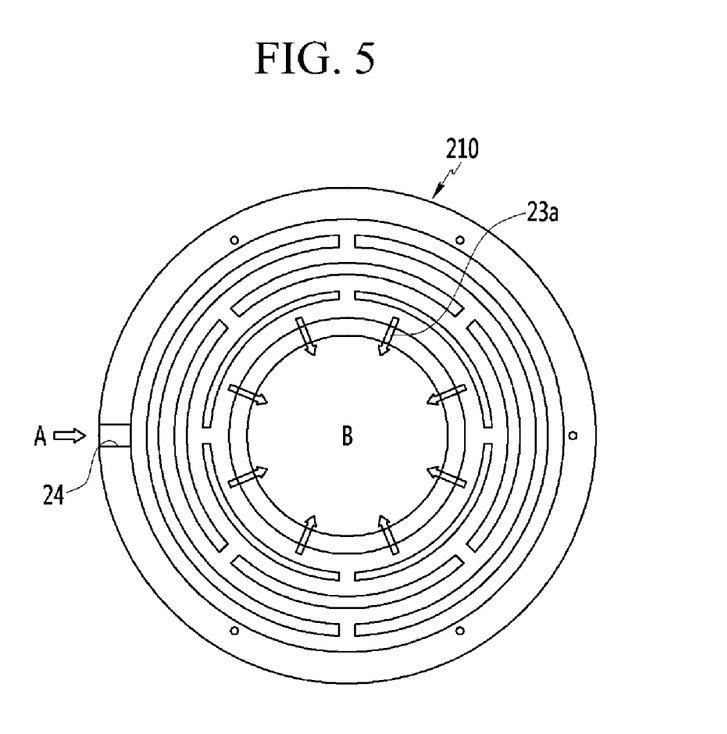
FIG. 5 is a plan view illustrating the gas supply plate according to an exemplary embodiment of the present invention.

The gas supply plate 210 of the deposition apparatus according to an exemplary embodiment of the present invention will be described in detail with reference to FIGS. 3 to 5. FIG. 3 is a view illustrating a section of a gas supply plate of the deposition apparatus according to an exemplary embodiment of the present invention. FIG. 4 is a perspective view illustrating the gas supply plate according to an exemplary embodiment of the present invention. FIG. 5 is a plan view illustrating the gas supply plate according to an exemplary embodiment of the present invention.

Referring to FIGS. 3 to 5, the gas supply plate 210 of the deposition apparatus according to an exemplary embodiment of the present invention is connected to the inlet portion 201, and includes a gas inlet hole 24 into which the gas from the gas inlet portion 201 is introduced. The gas inlet hole 24 is formed through an outer wall 21 of the gas supply plate 210.

A plurality of partitions 25 defining a gas movement route are formed inside of the gas supply plate 210 formed of the inner sidewall 22a, the outer wall 21, a bottom wall 28 and a top wall 27. The bottom wall 28 connects the inner sidewall 22a, the partitions 25 and the outer wall 21 at a bottom side of the gas supply plate 210. The top wall 27 connects the inner sidewall 22a, the partitions 25 and the outer wall 21 at a top side of the gas supply plate 210. The plurality of partitions 25 of the gas supply plate 210 have a ring structure, and are spaced apart from each other by a predetermined interval. The plurality of partitions 25 substantially provides a narrow gas movement route having a circular shape along with the inner sidewall 22a, the outer wall 21, the bottom wall 28 and the top wall 27. The gas supplied from the gas inlet hole 24 passes through the narrow gas movement route defined by the plurality of partitions 25 so that a flow rate is increased.

Parts of the plurality of partitions 25 are removed at a predetermined interval to provide the gas path 26 so that the supplied gas may be moved inside of the gas supply plate 210. For example, an outermost partition 25 among the plurality of partitions 25 includes two gas paths 26, and an inner partition 25 includes four gas paths 26. Further, the gas path 26 of the outermost partition 25 does not overlap with the gas path 26 of the inner partition 25. However, the number of the plurality of partitions 25 and the number of gas paths 26 of the partition 25 may be changed. A deposition apparatus according to another exemplary embodiment of the present invention may include a different number of partitions and gas paths from the number of partitions and the gas paths shown in FIGS. 3 to 5.

The gas having an increased flow rate when the gas passes through a narrow gas movement route having a circular shape defined by the plurality of partitions 25 is moved into the gas supply plate 210 through the gas path 26. The gas is moved into the gas supply plate 210 and passes through the narrow gas movement route having a circular shape defined by increased inner partition 25 so the flow rate is increased.

As shown in FIG. 4, a plurality of gas inlet holes 23a is formed at an inner sidewall of the gas supply plate 210. The plurality of gas inlet holes 23a is spaced apart from each other by a predetermined interval.

The gas having an increased flow rate when the gas passes through the gas movement route having a circular shape defined by the plurality of partitions 25 of the gas supply plate 210 is supplied to the plasma generation part 230 through the plurality of gas inlet holes 23a spaced apart from each other by a predetermined interval. Accordingly, the gas supply plate 210 increases the supply efficiency of the gas.

In addition, since the plurality of gas inflow holes 23a are spaced apart from each other by a predetermined interval around the plasma generation part 230, the gas having a uniform density is supplied to the plasma generation part 230 around the plasma electrode 220, so that the plasma having a uniform density is generated in the plasma generation part 230.

As described above, the plasma generation part 230 is defined by a space between the plasma electrode 220 and an inner wall of the plasma chamber 200a as a space to surround the cylindrical plasma electrode 220. The space between the cylindrical plasma electrode 220 and the inner wall of the plasma chamber 200a has a predetermined interval. It is preferable that the predetermined interval is not changed according to a position. Accordingly, the plasma generation part 230 may have a uniform width so that plasma having the uniform density may be generated, not being changed according to a position.

In order to prevent arcing in the plasma generation part 230, it is preferable that the space between the plasma electrode 220 and the inner wall of the plasma chamber 200a has an interval of about 0.1 mm to about 30 mm.

In this manner, gas A supplied to the gas supply plate 210 passes through a gas movement route defined by a partition of the gas supply plate 210 so that a flow rate of the gas is increased. Gases with the increased flow rate may be simultaneously supplied toward (B) the plasma generation part 230 through the plurality of gas inlet holes 23a.

The deposition apparatus according to the present exemplary embodiment may include the gas supply plate 210 capable of supplying gas having a uniform density to the plasma generation part 230 having a predetermined width surrounding the cylindrical plasma electrode 220 to supply plasma having a uniform density to the reactor 101 while using a remote plasma supply unit.

The sizes of the reactor and the plasma chamber of the deposition apparatus according to the exemplary embodiments are illustrative only for the present invention, the present invention should not be understood to be limited thereto, and various changes and modifications of the embodiments described herein can be made.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus comprising:
   a reactor;
   a plasma chamber connected to the reactor;
   a plasma electrode mounted inside of the plasma chamber; and
   a gas supply plate coupled with the plasma chamber to supply gas into the plasma chamber,
   wherein:
   the gas supply plate comprises:
   an inner sidewall having a plurality of gas inlet holes spaced apart from each other by a predetermined interval;
   an outer wall having one gas inlet hole connected to a gas supply pipe;
   a plurality of partitions disposed between the inner sidewall and the outer wall;
   a bottom wall connecting the inner sidewall, the partitions and the outer wall at a bottom side of the gas supply plate; and
   a top wall connecting the inner sidewall, the partitions and the outer wall at a top side of the gas supply plate,
   wherein the bottom wall and the to wall form a gas flow route along with the inner sidewall, the partitions and the outer wall,
   wherein the plurality of partitions are arranged on at least a circle and spaced apart from each other with a plurality of gaps therebetween,
   wherein the gas supply plate has a ring structure and the plurality of gas inlet holes surrounds a periphery of the plasma electrode, and
   wherein the inner side wall of the gas supply plate is spaced apart from the plasma electrode with a gap therebetween.

2. The deposition apparatus of claim 1, wherein:
   the plasma electrode has a cylindrical shape, and
   a plasma generation part is a space between an inner wall of the plasma chamber and the plasma electrode.

3. The deposition apparatus of claim 2, wherein the space between the inner wall of the plasma chamber and the plasma electrode has a predetermined width.

4. The deposition apparatus of claim 1, wherein:
   the plurality of gaps form gas paths.

5. The deposition apparatus of claim 1, wherein:
   the plurality of partitions comprise:
   a first group of partitions arranged on a first circle and spaced apart from each other with a plurality of first gaps therebetween; and
   a second group of partitions arranged on a second circle and spaced apart from each other with a plurality of second gaps therebetween, and wherein the first circle and the second circle are concentric and the second circle encloses the first circle.

6. The deposition apparatus of claim 5, wherein:
the first gaps do not overlap the second gaps.

7. The deposition apparatus of claim 5, wherein:
the plurality of partitions further comprise:
a third group of partitions arranged on a third circle and spaced apart from each other with a plurality of third gaps therebetween, and
wherein the third circle and the second circle are concentric and the third circle encloses the second circle.

8. The deposition apparatus of claim 5, wherein:
the inner sidewall and the outer wall respectively have a ring shape disposed on concentric circles which are concentric with the first circle.

9. The deposition apparatus of claim 5, wherein:
the plurality of partitions respectively have an arc shape.

10. The deposition apparatus of claim 1, wherein:
the plurality of partitions respectively have an arc shape.

11. The deposition apparatus claim 7, wherein:
the first circle, the second circle and the third circle are arranged on a same plane.

\* \* \* \* \*